(12) United States Patent
Maejima et al.

(10) Patent No.: US 10,310,513 B2
(45) Date of Patent: Jun. 4, 2019

(54) CONVEYANCE CONTROL DEVICE AND MERGING POINT PASSING METHOD FOR CARRYING CART

(71) Applicants: DAIFUKU CO., LTD., Osaka-shi, Osaka (JP); HOKUYO AUTOMATIC CO., LTD., Osaka-shi, Osaka (JP)

(72) Inventors: Yoji Maejima, Osaka (JP); Tadashi Nishikawa, Gamo-gun (JP); Yoshitaka Tanaka, Gamo-gun (JP)

(73) Assignees: DAIFUKU CO., LTD., Osaka (JP); HOKUYO AUTOMATIC CO., LTD., Osaka (JP)

( * ) Notice: Subject to any disclaimer, the term of this patent is extended or adjusted under 35 U.S.C. 154(b) by 0 days.

(21) Appl. No.: 15/463,872

(22) Filed: Mar. 20, 2017

(65) Prior Publication Data

US 2017/0283182 A1     Oct. 5, 2017

(30) Foreign Application Priority Data

Mar. 29, 2016   (JP) ................................ 2016-065039

(51) Int. Cl.
| | |
|---|---|
| *G05D 1/02* | (2006.01) |
| *G05D 1/03* | (2006.01) |
| *B65G 35/08* | (2006.01) |
| *B65G 43/00* | (2006.01) |
| *B65G 47/68* | (2006.01) |

(Continued)

(52) U.S. Cl.
CPC ........... *G05D 1/0289* (2013.01); *B65G 35/08* (2013.01); *B65G 43/00* (2013.01); *B65G 47/681* (2013.01); *G05D 1/03* (2013.01); *H01L 21/67259* (2013.01); *H01L 21/67715* (2013.01); *H01L 21/67733* (2013.01); *H01L 21/67736* (2013.01);

(Continued)

(58) Field of Classification Search
CPC ......... B65G 43/00; G05D 1/03; G05D 1/0289
See application file for complete search history.

(56) References Cited

U.S. PATENT DOCUMENTS

| | | | | |
|---|---|---|---|---|
| 2014/0202829 A1* | 7/2014 | Eberhardt | .............. | G01N 35/04 |
| | | | | 198/341.01 |
| 2014/0277699 A1* | 9/2014 | Moix | ..................... | G01N 35/04 |
| | | | | 700/230 |
| 2014/0305227 A1* | 10/2014 | Johns | ................... | B01D 21/262 |
| | | | | 73/863.01 |

FOREIGN PATENT DOCUMENTS

| | | |
|---|---|---|
| JP | S63-73303 A | 4/1988 |
| JP | 2000-250627 A | 9/2000 |

(Continued)

*Primary Examiner* — Thomas Randazzo
(74) *Attorney, Agent, or Firm* — Oliff PLC (57) ABSTRACT

A conveyance control device executes: a control step of detecting entering to a merging point adjacent area set on adjacent to each merging point on the conveyance route; a detection step of detecting whether there is an obstacle around the carrying cart; a communication step of performing, when the entering to each merging point adjacent area is detected, local wireless communications with another carrying cart by using a common frequency band and a common identification code set to values different among merging points; and a merging point passing control step of starting the communication step when the other carrying cart is detected in the merging point adjacent area in the detection step, and causing passing of a merging point in accordance with a priority set to each entering passage to the merging point, after a handshake with the other carrying cart is successfully performed in the communication step.

20 Claims, 8 Drawing Sheets

(51) Int. Cl.
*H01L 21/67* (2006.01)
*H01L 21/677* (2006.01)
*B65G 1/04* (2006.01)

(52) U.S. Cl.
CPC .... *B65G 1/0421* (2013.01); *B65G 2201/0297* (2013.01); *G05D 2201/0216* (2013.01)

(56) References Cited

FOREIGN PATENT DOCUMENTS

| | | | | | |
|---|---|---|---|---|---|
| JP | 2000250627 | A | * | 9/2000 | ............... G05D 1/02 |
| JP | 2010-257184 | A | | 11/2010 | |
| WO | WO-2012108098 | A1 | * | 8/2012 | ....... H01L 21/67715 |

* cited by examiner

CONVEYANCE CONTROL DEVICE AND MERGING POINT PASSING METHOD FOR CARRYING CART

CROSS-REFERENCE TO RELATED APPLICATIONS

The present application claims priority under 35U.S.C. 119 to Japanese Patent Application No. 2016-65039 filed on Mar. 29, 2016, the contents of this application are incorporated herein by reference in their entirety.

BACKGROUND OF THE INVENTION

Field of the Invention

The present invention relates to a conveyance control device and a merging point passing method for a carrying cart.

Description of the Related Art in a manufacturing facility for a semiconductor device, a semiconductor wafer is automatically conveyed between manufacturing devices. This is achieved with a carrying cart that conveys a wafer carrier accommodating a plurality of semiconductor wafers placed on a loading port of each manufacturing device.

The carrying cart includes a traveling section and an item accommodating section supported by the traveling section. The traveling section autonomously travels along a traveling rail defining a route. The traveling rail is arranged in an upper space in the manufacturing facility so that physical contact with people and machines can be prevented. The carrying cart further includes a lifting and lowering mechanism that lifts and lowers a lifted and lowered member, including a chuck mechanism that holds a conveyance target object, along a predetermined lifting and lowering passage.

The route has a complex shape for conveying the wafer carrier in accordance with a layout of the manufacturing facilities. More specifically, the route not only includes a simple straight portion but also includes a curve, a branched portion, a merging portion, or the like. A plurality of carrying carts travel on the same route.

In recent years, a large number of carrying carts are required to travel on the same route at a high speed, to achieve a higher wafer carrier conveyance efficiency. Thus, efficient travel control is required for the carrying cart at the merging point in the route.

Japanese Unexamined Patent Application Publication No. S63-73303 discloses an intersection control method for a self-driving vehicle. The self-driving vehicle includes: a detection unit configured to detect whether the vehicle has arrived at and passed through an intersection area; a reception unit configured to receive radio waves from another self-driving vehicle in the intersection area; a determining unit configured to determine whether the other self-driving vehicle is in the intersection area based on the radio waves received by the reception unit; a unit configured to determine a priority for entering the intersection to prevent a plurality of self-driving vehicles from simultaneously entering the intersection area; and a transmission unit configured to intermittently perform transmission at an interval set in advance, until the vehicle enters and passes through the intersection area.

Figure 8:
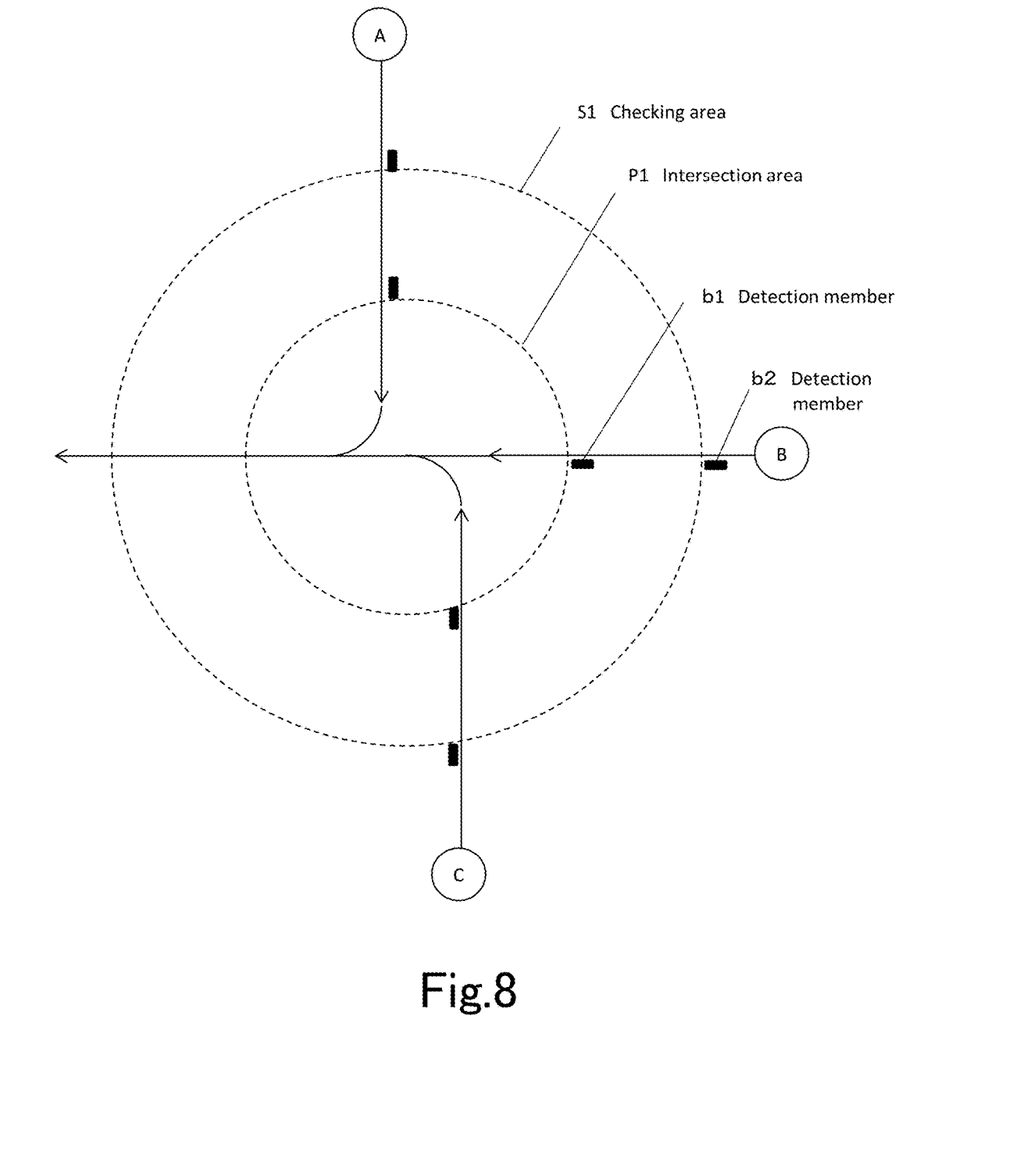
FIG. 8 is a diagram illustrating a conventional technique.

As illustrated in FIG. 8, in a traveling route, an intersection area P1 surrounding an intersection and an entering checking area S1 on an upstream side of the intersection area P1 are set. Detection members b1 and b2, including reflective tape, detectable by a detection unit in the self-driving vehicle are arranged on positions on the immediately upstream side of the areas. The reference numerals in FIG. 8 are unrelated to the reference numerals used in

DETAILED DESCRIPTION OF THE EMBODIMENTS

When the detection unit determines that the self-driving vehicle has entered the entering checking area S1, whether the radio waves are transmitted from the other self-driving vehicle is checked with the reception unit. A frequency of the radio waves is set to different values between the intersection areas P1. Thus, whether the other self-driving vehicle is in the intersection area P1 is determined based on the frequency. Upon determining that there is no other self-driving vehicle in the intersection area P1, the self-driving vehicle intermittently transmits the radio waves, at the frequency set to the intersection, at an interval uniquely set for each self-driving vehicle, until the vehicle enters and passes through the intersection area P1.

Upon determining that there is another self-driving vehicle in the intersection area P1, the self-driving vehicle stops on the immediately upstream side of the intersection area P1 until the radio waves from the other self-driving vehicle are no longer received. Then, when the radio waves are no longer received, the self-driving vehicle enters the intersection area P1.

When a plurality of self-driving vehicles are waiting on the immediately upstream side of the intersection area P1, the self-driving vehicles alternately perform the transmission, for a predetermined period, and reception, for the remaining period at the interval uniquely set for each self-driving vehicle, and each stay in the stopped state as long as a transmission from another self-driving vehicle is received. In this manner, control is performed in such a manner that the plurality of self-driving vehicles are prevented from entering the intersection area P1 at the same time.

Japanese Unexamined Patent Application Publication No. 2000-250627 discloses a traveling control method for an automated guided vehicle. With the method, control can be performed in such a manner that a high conveyance efficiency can be achieved with a large number of automated guided vehicles entering a merging zone as quickly as possible while guaranteeing two automated guided vehicles prevented from simultaneously entering the merging zone.

In this traveling control method for an automated guided vehicle, a plurality of automated guided vehicles travel on a common conveyance route, while restricting each other's traveling by using wireless communications between the automated guided vehicles, Specifically, the method includes: setting a merging zone around an intersection on the conveyance route; setting a checking area on an outer side of an entrance of each merging zone; causing an automated guided vehicle that has arrived at an entrance of the checking area to enter the checking area while alternately performing the reception and the transmission; causing the automated guided vehicle that has received a signal from another vehicle while traveling in the checking area to stop the transmission, move forward to the entrance of the merging zone, wait at the entrance while maintaining the reception, and enter the merging zone when the signal is no longer received during the waiting; and causing the automated guided vehicle that has reached the entrance of the merging zone without receiving the signal from the other vehicle to enter the merging zone without waiting and to stop the communication operation at an exit of the merging zone.

Japanese Unexamined Patent Application Publication No. 2010-257184 discloses an intersection control device and an intersection control method for an automated guided vehicle including controlling entering to and exiting from an intersection performed with an obstacle in the intersection directly detected.

An intersection is divided into: a first area set at an intersecting portion between traveling routes; second areas that are set to the traveling routes and are in contact with outer sides of the first area; and third areas that are set to the traveling routes and are in contact with outer sides of the second areas. An area sensor is provided to the intersection to detect whether there is an obstacle or a change has occurred in each area.

The intersection control device is configured to: cause an automated guided vehicle that has entered the intersection to wait in one third area; detect an obstacle in all the areas with the area sensor; give a permission to enter the intersection to the waiting automated guided vehicle when there is no obstacle in the first area and the second area; and when there is an obstacle in the first area and the second area, not to give the permission to enter the intersection to the waiting automated guided vehicle until the obstacle is removed from the first area and the second area.

In the intersection control technique described in Japanese Unexamined Patent Application Publication No. S63-73303, each self-driving vehicle, entering the plurality of entering checking areas, needs to intermittently transmit radio waves at a frequency set to each intersection area, and determine whether the reception frequency is the frequency corresponding to the intersection area to be entered. When the received radio waves are too weak to detect the frequency, the reception operation needs to be continued until it is confirmed that the frequency does not correspond to that of the intersection area for preventing collision.

Thus, to guarantee the safety of the system, the radio waves of a certain strength or more need to be transmitted. As a result, radio waves transmitted from the plurality of intersection areas are likely to interfere with each other.

Furthermore, whether there is another self-driving vehicle needs to be determined by receiving the unilaterally transmitted radio waves. Thus, the plurality of self-driving vehicles might make erroneous detection due to the interference, and simultaneously enter the intersection area. This also means that the vehicle might stop at the entering checking area even when there is no other self-driving vehicle in the intersection area.

In the intersection control technique described in Japanese Unexamined Patent Application Publication No. 2000-250627, the automated guided vehicle alternately performs the reception and the transmission, and stops the transmission when a transmission from a communication partner is received. A risk of the transmission timings and the reception timings of the automated guided vehicles overlap cannot be eliminated. Thus, the risk of causing the interference can be lowered but cannot be completely eliminated. In any case, the operation is unilaterally performed by receiving radio waves transmitted from an unspecified communication partner. Thus, there is room for improvement in terms of improving reliability by performing the operation after checking the communication partner.

In the intersection control technique described in Japanese Unexamined Patent Application Publication No. 2010-257184, the area sensor that detects an obstacle in each intersection and a facility for performing the traveling control at the intersection based on the area sensor are required. Thus, a high facility cost is required.

The present invention is made in view of the above, and an object of the present invention is to provide a conveyance control device and a merging point passing method for a carrying cart with which passing of a merging point can be achieved more certainly and safely, without increasing the facility cost and wireless interference.

To achieve the above-described object, a conveyance control device according to the present invention is installed in a carrying cart and configured to perform traveling control based on an instruction from a system controller in such a manner that the carrying cart travels along a predetermined conveyance route and includes: a merging point adjacent area entering detection control unit configured to detect entering to a merging point adjacent area set on adjacent to each merging point on the conveyance route; an obstacle detection unit configured to detect whether there is an obstacle around the carrying cart; a wireless communication unit configured to perform, when the merging point adjacent area entering detection control unit detects the entering to each merging point adjacent area, local wireless communications with another carrying cart by using a common frequency band and a common identification code set to values different among merging points; and a merging point passing control unit configured to start the wireless communication unit when the obstacle detection unit detects the other carrying cart in the merging point adjacent area, and to cause passing of a merging point in accordance with a priority set to each entering passage to the merging point, after a handshake with the other carrying cart is successfully performed with the wireless communication unit.

The wireless communication unit is preferably configured to perform the handshake with a conveyance control device of the carrying cart that has entered through an entering passage with a high priority serving as a master station and a conveyance control device of a carrying cart that has entered through an entering passage with a low priority serving as a slave station, and the merging point passing control unit is preferably configured to cause passing in such a manner that the carrying cart that has entered through the entering passage with the high priority preferentially passes through the merging point, when the handshake is successfully performed.

The carrying cart that has entered through the entering passage with the low priority is preferably configured to pass through the merging point, after a merging point passing completion signal has been received from the carrying cart that has entered through the entering passage with the high priority or when the handshake is not succeeded.

The merging point adjacent area entering detection Control unit is preferably configured to detect a marker disposed adjacent to the entering passage to each merging point, to determine entering to a corresponding merging point adjacent area.

The conveyance control device preferably further includes a storage unit configured to store in advance, a frequency band and an identification code set to each merging point and/or priority of each entering passage.

The carrying cart is preferably configured to pass through the merging point without starting the wireless communication unit or the merging point passing control unit, when the obstacle detection unit does not detect the other carrying cart.

The conveyance control device preferably further includes an optical communication unit configured to perform communications with Which a load is transferred between the carrying cart and a station used for transferring the load under control by the conveyance control device, the wireless communication unit being integrally embedded in the optical communication unit, and the conveyance control device is preferably configured to start, when the merging point adjacent area entering detection control unit detects the entering to the merging point adjacent area, the wireless communication unit instead of the optical communication unit and to start, when the carrying cart comes close to the station, the optical communication unit instead of the wireless communication unit.

A merging point passing method for a carrying cart according to the present invention, the method being performed by a conveyance control device that is installed in a carrying cart and configured to perform traveling control based on an instruction from a system controller in such a manner that the carrying cart travels along a predetermined conveyance route, includes: a merging point adjacent area entering detection control step of detecting entering to a merging point adjacent area set on adjacent to each merging point on the conveyance route; an obstacle detection step of detecting whether there is an obstacle around the carrying cart; a wireless communication step of performing, when the entering to each merging point adjacent area is detected in the merging point adjacent area entering detection control step, local wireless communications with another carrying cart by using a common frequency band and a common identification code set to values different among merging points; and a merging point passing control step of starting the wireless communication step when the other carrying cart is detected in the merging point adjacent area in the obstacle detection step, and causing passing of a merging point in accordance with a priority set to each entering passage to the merging point, after a handshake with the other carrying cart is successfully performed in the wireless communication step.

The wireless communication step preferably includes performing the handshake with a conveyance control device of the carrying cart that has entered through an entering passage with a high priority serving as a master station and a conveyance control device of a carrying cart that has entered through an entering passage with a low priority serving as a slave station, and the merging point passing control step preferably includes causing passing in such a manner that the carrying cart that has entered through the entering passage with the high priority preferentially passes through the merging point, when the handshake is successfully performed.

The carrying cart that has entered through the entering passage with the low priority is preferably configured to pass through the merging point, after a merging point passing completion signal has been received from the carrying cart that has entered through entering passage with the high priority or when the handshake is not succeeded.

The merging point adjacent area entering detection control step preferably includes detecting a marker disposed adjacent to the entering passage to each merging point, to determine entering to a corresponding merging point adjacent area.

A frequency band and an identification code set to each merging point and/or priority of each entering passage are preferably stored in advance in a storage unit included in the conveyance control device.

The carrying cart is preferably configured to pass through the merging point without starting the wireless communication step or the merging point passing control step, when the obstacle detection step does not detect the other carrying cart.

A merging point passing method for a carrying carts according to the present invention is a merging point passing method for a plurality of carrying carts autonomously traveling along a conveyance route, and includes: causing one of the carrying carts entering a merging point adjacent area to stop or decelerate when another one of the carrying carts is detected; causing the one of the carrying carts to perform wireless communications with the other one of the carrying carts by using a common frequency band and identification code that are set to different values among merging points; and causing one of the carrying carts corresponding to a high priority to preferentially pass through the merging point when a handshake is successfully performed, and then causing another one of the carrying carts corresponding to a low priority to pass through the merging point when the handshake is not succeeded, the priority being set to each entering passage to the merging point.

The carrying carts entering the merging point adjacent area are preferably each configured to pass through the merging point without stopping, when another one of the carrying carts is not detected.

Other aspects of the present invention will be clearly described with reference to the embodiments described below.

BRIEF DESCRIPTION OF THE DRAWINGS

Some embodiments of the present disclosure are shown by way of example, and not limitation, in the accompanying figures.

DETAILED DESCRIPTION OF THE EMBODIMENTS

A conveyance control device and a merging point passing method for a carrying cart according to the present invention are described below with an automated guided vehicle in a manufacturing facility for a semiconductor device as an example. An object of the present invention is to prevent collision when a plurality of carrying carts attempt to simultaneously enter a merging point CP.

Figure 1:
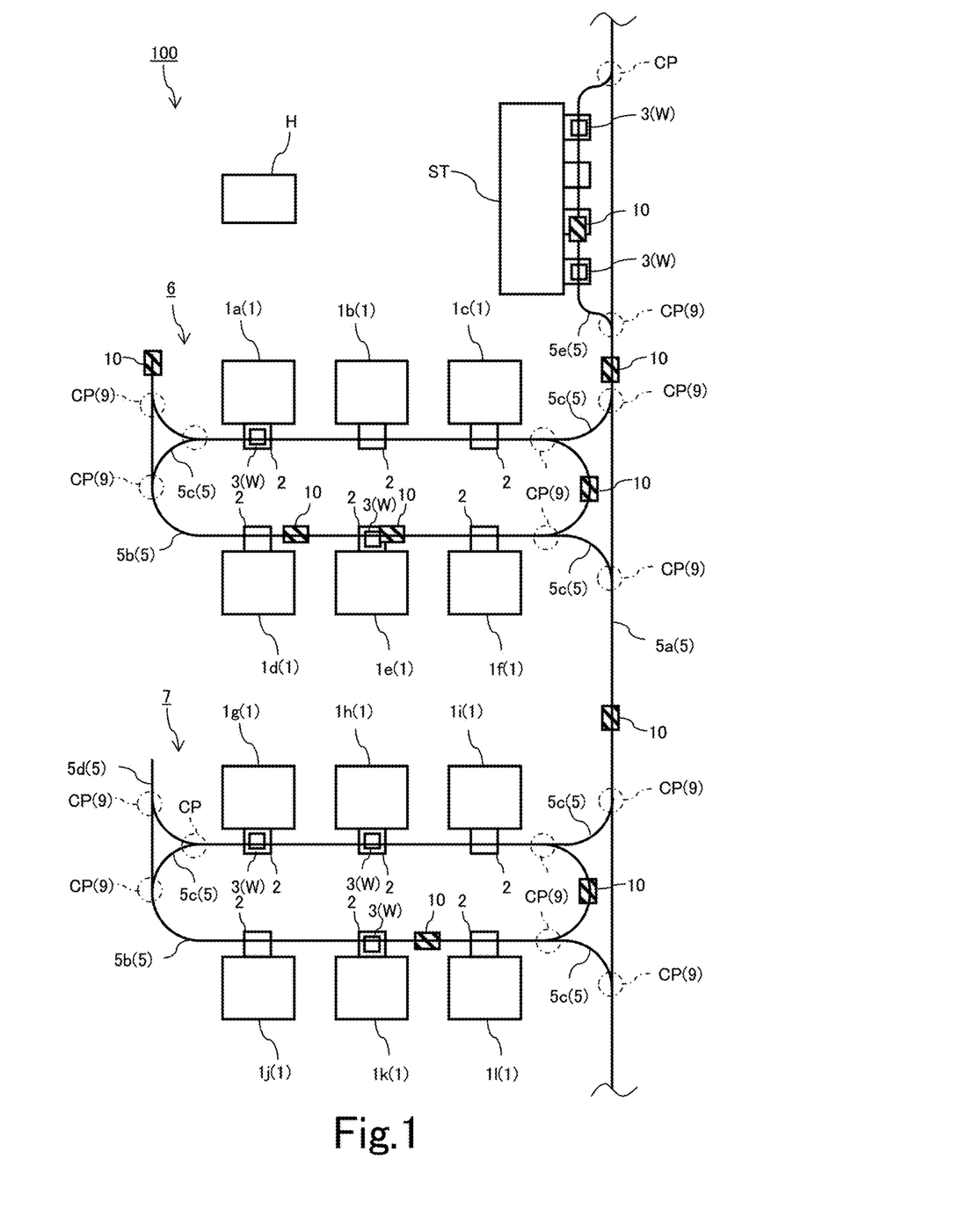
FIG. 1 is a diagram illustrating a manufacturing facility for a semiconductor device and carrying carts.

As illustrated in FIG. 1, a manufacturing facility 100 for a semiconductor device includes: various manufacturing devices 1 (1*a* to 1*l*) that are arranged along a predetermined route and sequentially execute predetermined processing on a semiconductor wafer; traveling rails 5 suspended from a ceiling in such a manner as to extend along the manufacturing devices 1; and a plurality of carrying carts 10 that travel along the traveling rails 5 to automatically convey the semiconductor wafer W among the manufacturing devices 1 (1*a* to 1*l*). The manufacturing devices 1 (1*a* to 1*l*) are arranged separately into bays 6 and 7 each corresponding to a series of associated manufacturing steps.

Each of the carrying cart 10 holds a wafer carrier 3 based on an instruction from a system controller H. The wafer carrier 3 is placed on a loading port 2 of the manufacturing device 1, and accommodates a plurality of semiconductor wafers W. Then, the carrying cart 10 moves between the manufacturing devices 1 or between the manufacturing device 1 and a stocker ST where the wafer carrier 3 is temporarily stored, so that the wafer carrier 3 is placed on the loading port 2 at the conveyance destination.

The traveling rail 5 not only includes a simple straight portion but also includes a curve, a branched portion, a merging portion, and the like. For example, the traveling rail 5 includes: an inter-step rail 5*a* that establishes connection between the bays 6 and 7; in-step rails 5*b* that each establish connection among the manufacturing devices 1 in a corresponding one of the bays 6 and 7; branched rails 5*c* that establish connection between the inter-step rail 5*a* and the in-step rail 5*b*; a side rail 5*d* with which the carrying cart 10 running on the in-step rail 5*b* is sidetracked; and a bypass rail 5*e* with which the carrying cart 10 picks up or loads the wafer carrier 3 on the stocker ST.

The branched rail 5*c* establishes connection between the inter-step rail 5*a* and the in-step rail 5*b*. Thus, the carrying cart 10 travels along the branched rail 5*c* to move between the inter-step rail 5*a* and the in-step rail 5*b*.

The side rail 5*d* is branched from the in-step rail 5*b*, and is used for temporarily sidetracking the carrying cart from the in-step rail 5*b* for maintenance of the carrying cart 10, for example.

The bypass rail 5*e* is branched from the inter-step rail 5*a*, and is used for a case where the wafer carrier 3, held by the carrying cart 10 traveling on the inter-step rail 5*a*, is to be temporarily stored on the stocker ST.

Connection points between the branched rail 5*c* and the inter-step rail 5*a*, between the branched rail 5*c* and the in-step rail 5*b*, between the side rail 5*d* and the in-step rail 5*b*, and between the bypass rail 5*e* and the inter-step rail 5*a* correspond to merging points CP (illustrated with a one dot chained circle in FIG. 1).

Figure 2:
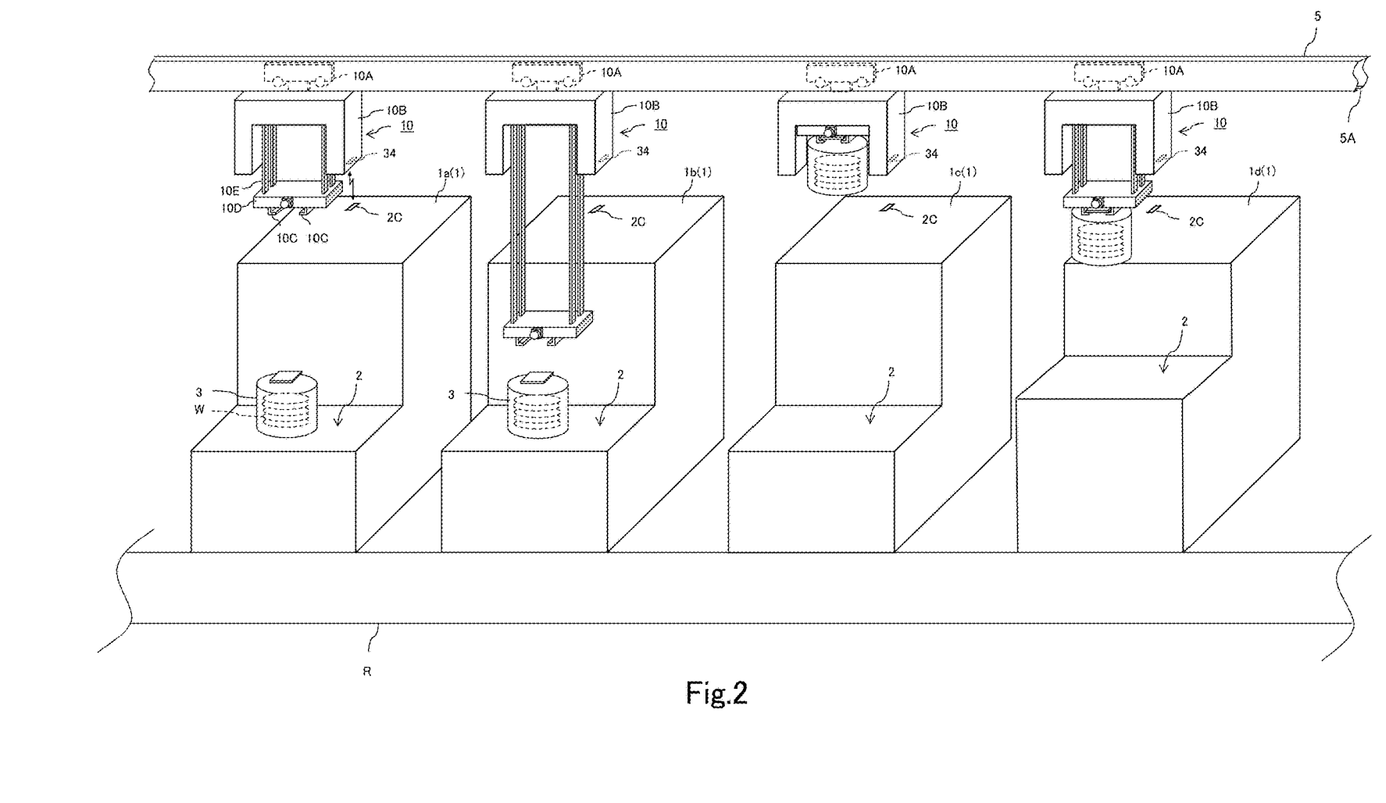
FIG. 2 is a diagram illustrating processing of transferring a wafer carrier between the carrying cart and a manufacturing device.

As illustrated in FIG. 2, the traveling rail 5 is a pipe shaped member having a rectangular cross-sectional shape with a slit shaped opening 5A extending along a longitudinal direction formed on a lower wall. The carrying cart 10 includes: a traveling section 10A that travels along an upper surface of an inner side of the lower wall of the pipe shaped member while sandwiching the slit 5A; and a holding section 10B that is coupled with the traveling section 10A with a coupling member and positioned below the lower wall of the pipe shaped member.

The traveling section 10A includes: a pair of front and rear wheels provided on a traveling base; a traveling motor that drives the wheels; a conveyance control unit with which the water carrier 3 is held and conveyed to the manufacturing device 1 as the destination; an obstacle detection unit that detects an obstacle in a traveling direction; and a power supply unit. A power line is disposed along the longitudinal direction on the inner side of side walls of the pipe shaped member. Thus, power can be received from the power line through the power supply unit provided on the traveling base. Data communications can be performed between the system controller H and the conveyance control unit with the power supply line serving as a communication medium.

The data communications between the system controller H and the conveyance control unit are not limited to the configuration using the power supply line as the communication medium, and may be performed wirelessly through electromagnetic waves serving as a communication medium. In the description below, the configuration using the wireless communications with the electromagnetic waves used as the communication medium instead of the power supply line may be employed.

The obstacle detection unit is connected to an obstacle sensor composed of a scanning type distance measurement device, using an infrared laser diode as a light source, and detects whether an obstacle (denoted with a reference numeral 26, 40 in FIG. 3) is on the forward side in the traveling direction.

The holding section 10B incorporates a lifting and lowering mechanism 10E including a belt and a winding motor with which a lifted and lowered member 10D, including a chuck mechanism 10C that holds the wafer carrier 3, is lifted and lowered along a predetermined lifting and lowering passage.

The traveling motor, the conveyance control unit, the obstacle detection unit, and the power supply unit form a conveyance control device C. The conveyance control device C performs overall control on the carrying cart 10 based on an instruction received from the system controller H via the power line. Thus, the carrying cart 10 receives a predetermined wafer carrier 3 from a predetermined manufacturing device 1 conveys the wafer carrier 3 to the manufacturing device 1 as the destination, and delivers the wafer carrier 3 to the loading port of the manufacturing device 1.

Figure 3:
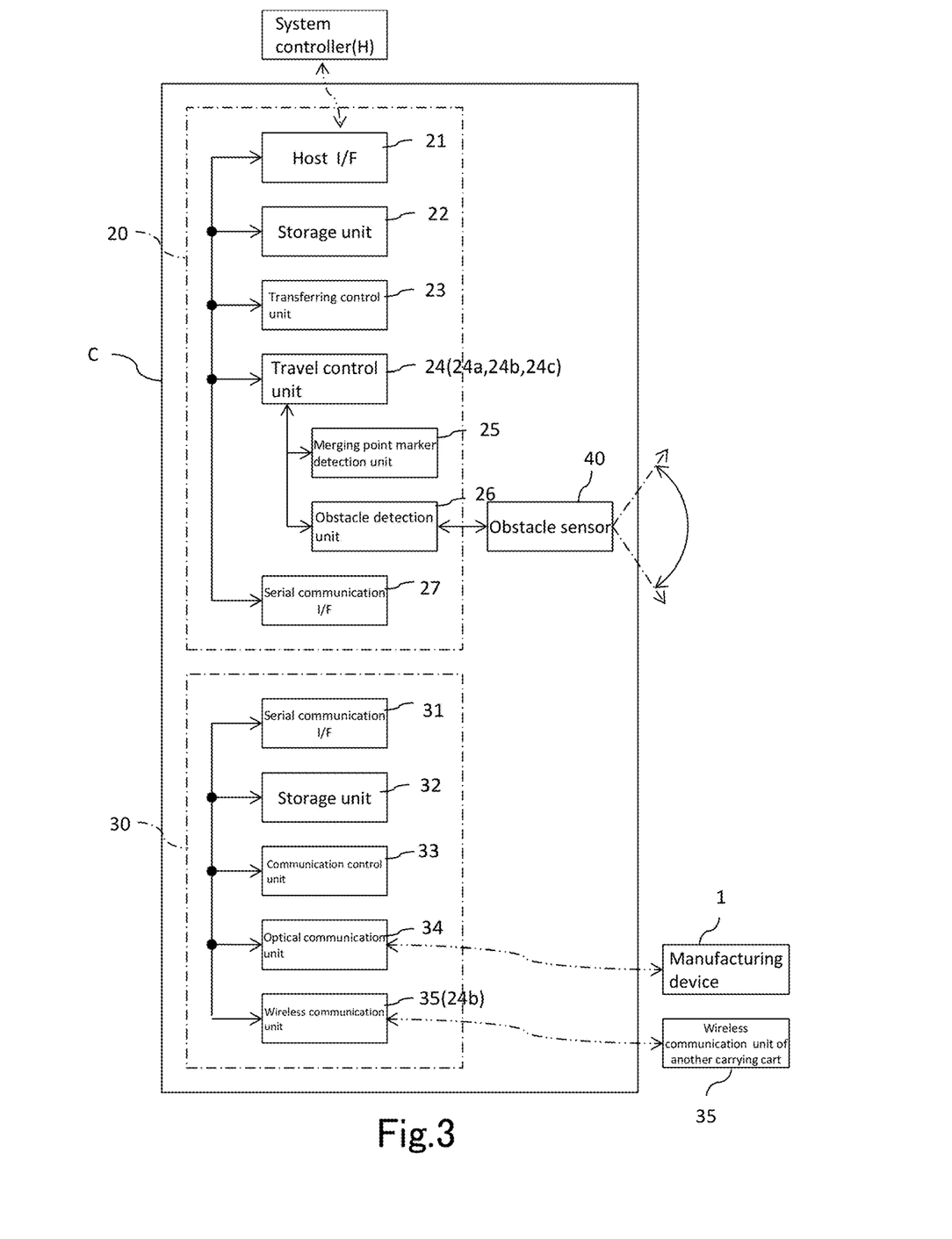
FIG. 3 is a functional block diagram of a conveyance control device.

FIG. 3 illustrates a functional block configuration of a main part of the conveyance control device C. The conveyance control device C includes: a conveyance control unit 20 that executes transferring control so that the carrying cart 10 is conveyed to the target manufacturing device 1 and the wafer carrier 3 is transferred between the loading port of the manufacturing device 1 and the carrying cart 10; and a local communication unit 30 that performs local communications with the manufacturing device 1 or with another carrying cart 10.

The conveyance control unit 20 includes: hardware including a high-spec microcomputer and a memory as well as a peripheral circuit such as an input/output circuit; and an electronic circuit in which a desired function is implemented when a control program stored in the memory is executed by a central processing unit (CPU) of the high-spec microcomputer.

The functional blocks of the conveyance control unit 20 are separately described. The functional blocks include: a host interface 21 that communicates with the system controller H via the power line; a storage unit 22 including a semiconductor memory that stores information transmitted from the system controller H and various types of control information; a transferring control unit 23 that executes transferring processing for transferring the wafer carrier 3 between the manufacturing device 1 and the carrying cart 10; a travel control unit 24 that performs the control based on the instruction from the system controller H so that the carrying cart 10 travels to the target manufacturing device 1 or the like; and a serial communication interface 27 that communicates with the local communication unit 30.

The local communication unit 30 includes: an optical communication circuit including a light emitting diode and a phototransistor; a wireless communication circuit including a wireless antenna, an oscillator, and a modulator-demodulator; and hardware including a low-spec microcomputer that controls the optical communication circuit and the wireless communication circuit and a memory. An optical communication function or wireless communications are implemented when the control program stored in the memory is executed by a CPU of the low-spec microcomputer.

Functional blocks of the local communication unit 30 are separately described. The functional blocks include: a serial communication interface 31 that communicates with the serial communication interface 27 provided in the conveyance control unit 20; an optical communication unit 34 that performs optical communications with an optical communication unit 2C provided in the manufacturing device 1; a wireless communication unit 35 that performs wireless communications with the other carrying cart 10; a communication control unit 33 that controls the optical communication unit 34 and the wireless communication unit 35; and a storage unit 32 including a semiconductor memory that stores data received from the conveyance control unit 20 via the serial communication interface 31, transmitted/received data used for the optical communication unit 34 and the wireless communication unit 35, and the like.

The communication control unit 33 drives the optical communication unit 34 or the wireless communication unit 35 for transmitting data required by a communication partner, based on an instruction transmitted from the conveyance control unit 20 via the serial communication interfaces 31 and 27, and transmits data received from the communication partner to the conveyance control unit 20.

The host interface 21 uses a TCP/IP protocol, and the serial communication interfaces 27 and 31 use an asynchronous serial communication protocol based on RS232C. The optical communication unit 34 operates based on a SEMI E84-0200A interface standard and the like. The wireless communication unit 35 performs packet communications by using a predetermined frequency band and a predetermined SSID (also referred to as an "identification code"). In the packet communications, one of the carrying carts serves as a master station Whereas the other one serves as a slave station.

The travel control unit 24 performs control so that the carrying cart 10 travels along a traveling route, transmitted from the system controller H and stored in the storage unit 22, and decelerates the carrying cart when approaching the manufacturing device 1, and starts the optical communication unit 34.

The conveyance control unit stops the carrying cart 10 at a position where the optical communications, between the optical communication unit 2C of the manufacturing device 1 and the optical communication unit 34 of the local communication unit 30, are established with optical axes matching due to the movement of the carrying cart 10. With the optical communications, the carrying cart 10 checks that the communication partner is the target manufacturing device 1, whereas the manufacturing device 1 checks that the communication partner is the carrying cart 10 to be received.

Then, the transferring control unit 23 starts for executing the transferring processing of the wafer carrier 3. In FIG. 2, a route on which the manufacturing devices 1 (1a, 1b, 1c, and 1d) are arranged is denoted with the reference numeral R. When the transferring processing executed by the transferring control unit 23 is terminated, the travel control unit 24 performs the traveling control for the next manufacturing device 1.

The storage unit 22 stores route information transmitted from the system controller H via the host interface 21 in advance. The travel control unit 24 performs the traveling control for the traveling to the destination, with a current traveling point, as one of points indicated by route information, recognized based on an output from a rotary encoder provided to the wheel of the travel control unit 24, and position checking performed by reading light reflecting markers provided on important points on a side wall inner surface of the traveling rail 5.

Some of the light reflecting markers are arranged immediately before and after a merging point adjacent area with a predetermined radius from the merging point CP illustrated in FIG. 1. Thus, entering to an entering passage to the merging point can be recognized based on the detection of the immediately upstream side marker and the entering to an exit route from the merging point care be recognized based on the detection of the immediately downstream side marker.

The travel control unit 24 performs control in such a manner that the carrying cart 10 passes through the merging point CP of the traveling rail 5 through a predetermined procedure, so as not to collide or contact with the other carrying cart 10 traveling on the other traveling rail 5. This merging point passing control executed by the travel control unit 24 is described in detail below.

The travel control unit 24 includes a merging point adjacent area entering detection control unit 24a, a wireless communication unit 24b, and a merging point passing control unit 24c. The merging point adjacent area entering detection control unit 24a includes: a merging point marker detection unit 25 including a reflective photosensor; and an obstacle detection unit 26 that detects whether the other carrying cart is in the merging point adjacent area. The wireless communication unit 35 described above is uses as the wireless communication unit 24b.

The merging point adjacent area entering detection control unit 24a may detect the entering to the merging point adjacent area set adjacent to each merging point, based on an output from the merging point marker detection unit 25. In this case, the carrying cart directly passes through the merging point CP when it is determined that there is no other carrying cart in the merging point adjacent area based on an output from the obstacle detection unit 26.

Figure 4A:
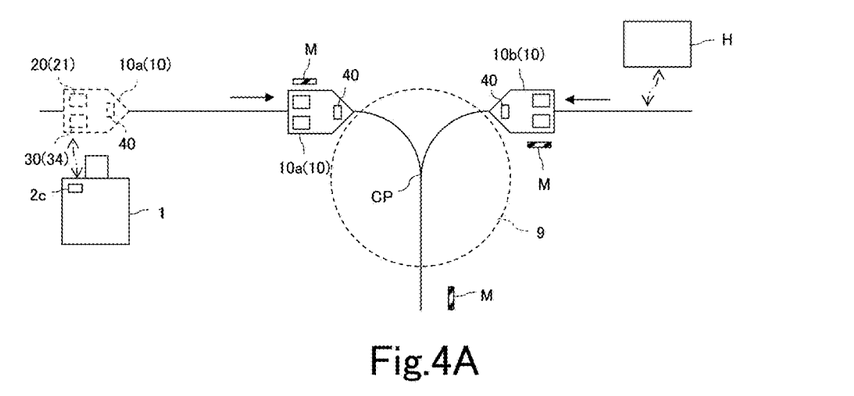
FIG. 4A, FIG. 4B, and FIG. 4C are each diagram illustrating a merging point passing method for the carrying cart.

As illustrated in FIG. 4A, the merging point adjacent area entering detection control unit 24a detects the entering to the merging point adjacent area 9 set adjacent to each merging point based on the output from the merging point marker detection unit 25. In this case, when it is determined that the other carrying cart 10 is in the merging point adjacent area 9 based on the output from the obstacle detection unit 26, the wireless communication unit 35 (24b) of the local communication unit 30 is started via the serial communication interface 27, and the traveling of the carrying cart 10 is stopped on the upstream side of the merging point CP, that is, a collision free position. In FIG. 4A, the marker is denoted with the reference numeral M.

The storage unit 22 stores the route information transmitted from the system controller H via the host interface 21 in advance, and stores frequency band data and the identification code, for the local communications, set to be different values among the merging points CP. The storage unit 22 also stores priority data provided to a route for entering each merging point. The information other than the route information may be stored as a default value in the storage unit in advance. The other information includes the frequency band data and the identification code, for the local communications, set to be different values among the merging point CP, and further includes the priority data.

Upon detecting the entering to the merging point adjacent area 9, the merging point adjacent area entering detection control unit 24*a* reads the frequency band and the identification code set to be different values among the merging points CP from the storage unit 22, and transmits the read information to the communication control unit 33. The communication control unit 33 stores the frequency band and the identification code in the storage unit 32. The communication control unit 33 starts the wireless communication unit 24*b* and performs the wireless communications with the wireless communication unit 24*b* of the other carrying cart 10 by using the frequency band and the identification code.

In this process, the carrying carts 10 wirelessly communicate with each other, with the one traveling on a route with a high priority, based on the priority data set to the route for entering each merging point, serving as the master station, and the one traveling on a route with a low priority serving as the wireless slave station.

The wireless communications between the master station and the wireless slave station are based on the frequency band and the identification code uniquely set to each merging point CP, and thus are free of a risk of interference with a signal in a frequency band used at the other merging point, and thus do not require particularly strong radio waves. The wireless communications at each merging point CP are based on the common identification code of the merging point CP, and thus the wireless communications corresponding to the merging point CP are guaranteed, whereby high reliability is achieved.

When the wireless communication unit 24*b* successfully performs handshake with another carrying cart, information indicating the successful handshake is transmitted to the merging point adjacent area entering detection control unit 24*a* of the travel control unit 24 from the communication control unit 33 via the serial communication interfaces 31 and 27. As a result, the merging point passing control unit 24*c* starts, and the merging point is passed through in accordance with the priority set for each entering passage to the merging point CP.

Figure 4B:
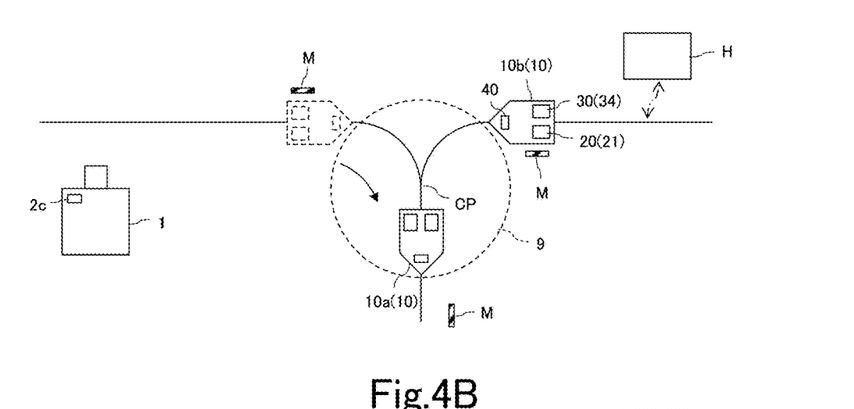

Specifically, as illustrated in FIG. 4B, the carrying cart 10 corresponding to a high priority preferentially passes though the merging point CP while maintaining the handshake state, and stops the wireless communications after passing through the merging point CP.

Figure 4C:
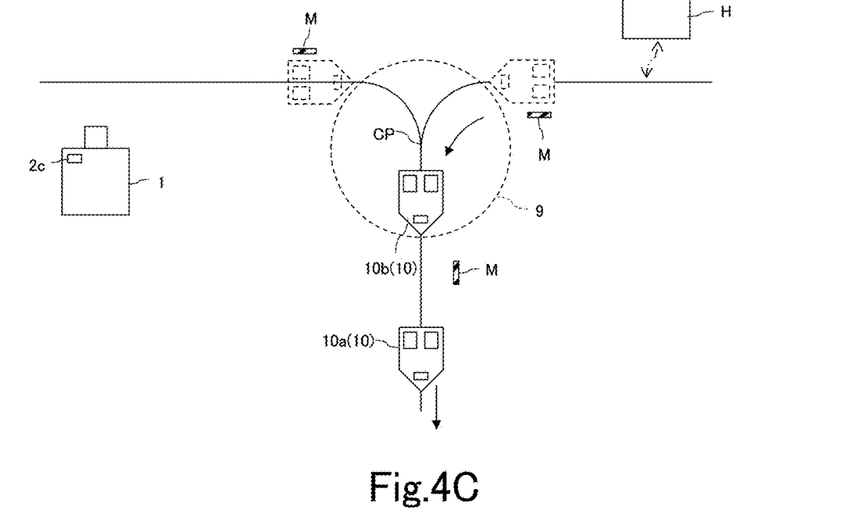

As illustrated in FIG. 4C, upon determining that the handshake is not succeeded or the communications are terminated, the carrying cart 10 that has entered the entering passage with a low priority determines that the carrying cart 10 corresponding to a high priority has passed through the merging point CP, and thus passes through the merging point CP.

In FIG. 4A, FIG. 4B, and FIG. 4C, the carrying cart 10 entering the merging point adjacent area 9 from the route with a high priority is denoted with the reference numeral 10*a*, and the carrying cart 10 entering the merging point adjacent area 9 from the route with a low priority is denoted with the reference numeral 10*b*.

In the configuration described above, the handshake can be smoothly performed through the wireless communications performed with the carrying cart corresponding to a high priority serving as the master station and the carrying cart corresponding to a low priority serving as the slave station, based on the priority set to the entering passage in advance.

The carrying cart 10 corresponding to a high priority may transmit a merging point passing completion signal through the wireless communications upon detecting a marker provided on the exit route from the merging point and determining that the carrying cart 10 has passed through the merging point CP, instead of terminating the wireless communications after passing through the merging point CP. Then, the carrying cart 10 entering the entering passage with a low priority may pass through the merging point CP after terminating the communications upon receiving the merging point passing completion signal.

The carrying carts can each recognize whether the other cart exists based on whether the handshake succeeds through the wireless communications, and thus needless and unilateral transmission of electric waves is not required. Thus, there is almost no risk of interference of the electric waves, whereby power required for wireless communications can be saved.

In the present embodiment, the local communication unit 30 is a communication device having two functions obtained by adding the wireless communication unit 35 to a communication device that includes the optical communication unit 34 of a conventional configuration operating based on the SEMI E84-0200A interface standard and the like; the communication control unit 33 controlling the same; and the like.

More specifically, the wireless communication nit 35 is integrally incorporated in the optical communication unit 34 that is controlled by the conveyance control unit 20 and performs communications for transferring the wafer carrier 3 between the carrying cart 10 and the transfer target station 1. When the merging point adjacent area entering detection control unit detects the entering to the merging point adjacent area, the conveyance control unit 20 starts the wireless communication unit 35 instead of the optical communication unit 34. When the carrying cart 10 approaches the station 1, the optical communication unit 34 is started instead of the wireless communication unit 35.

Thus, a simplified configuration can be achieved with a single serial communication interface 31 serving as the communication interface between the conveyance control unit 20 and the optical communication unit 34 and the wireless communication unit 35, whereby the communication device requiring a small installed space can be achieved. The optical communication unit 34 and the wireless communication unit 35 never simultaneously operate, and thus can be integrally formed without increasing a control load on the microcomputer and the like controlling the units. All things considered, both of the functions can be implemented with a low-cost microcomputer.

Figure 5:
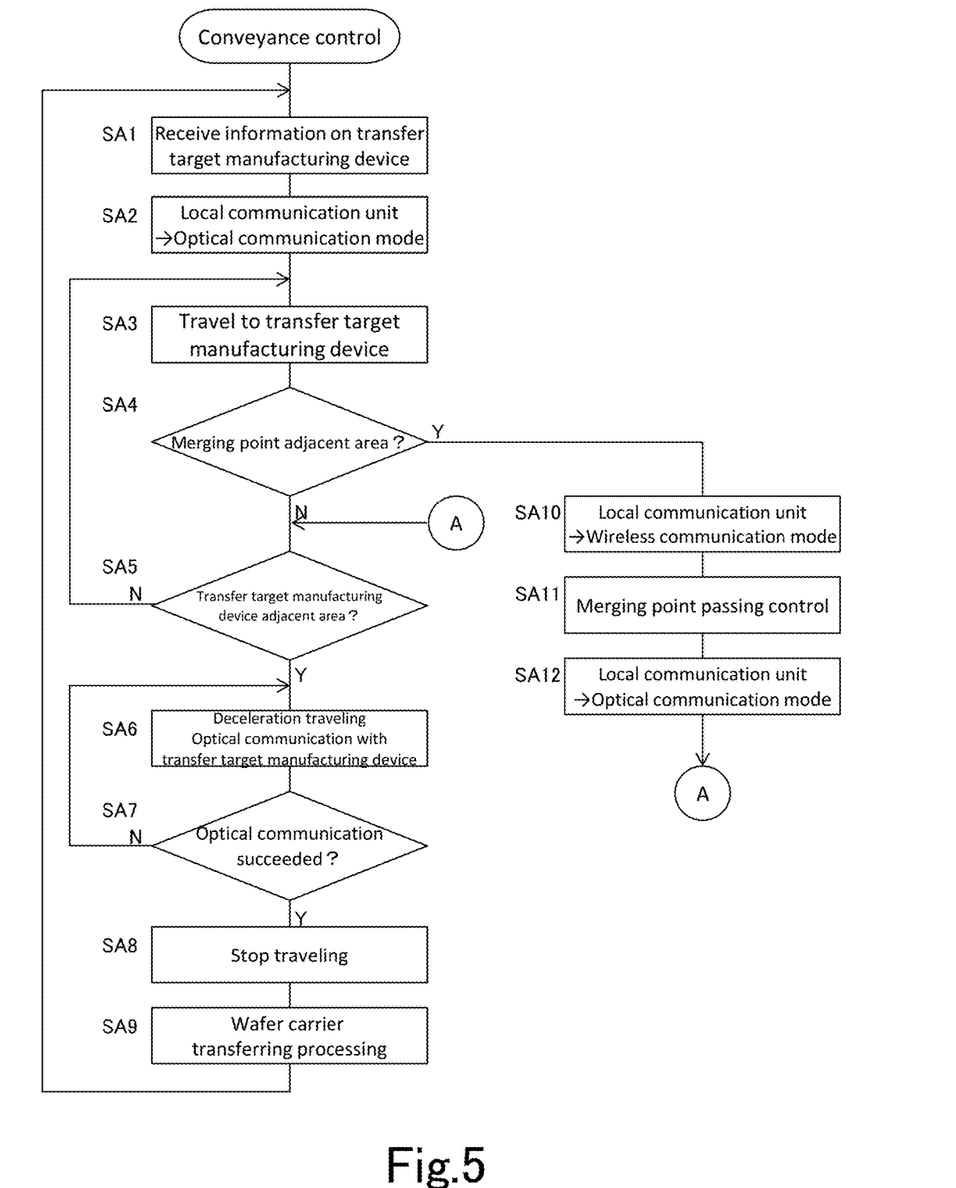
FIG. 5 is a flowchart illustrating traveling control performed by a conveyance control device.

As illustrated in FIG. 5, upon receiving the information on the manufacturing device 1 as the transfer target transmitted from the system controller H via the host interface 21, the travel control unit 24 performs traveling control for performing traveling to the manufacturing device 1 (SA1), instructs the communication control unit 33 of the local communication unit 30 to activate the optical communication unit 34 for operating in an optical communication mode (SA2), and performs the traveling control so that the carrying cart 10 travels to the transfer target manufacturing device 1 (SA3).

When the merging point marker detection unit 25 detects the merging point marker M while the carrying cart is traveling (SA4, Y), the communication control unit 33 of the local communication unit 30 is instructed to activate the wireless communication unit 35 so that the operation is performed in a wireless communication mode, and the traveling speed is reduced (SA10). Then, the merging point adjacent area entering detection control unit 24a performs the merging point passing control (SA11), and the carrying cart passes through the merging point. Thereafter, the communication control unit 33 of the local communication unit 30 is instructed to activate the optical communication unit 34 so that the operation in the optical communication mode is performed (SA12). Then, processing in step SA5 and after is executed.

When the carrying cart approaches the transfer target manufacturing device 1 (SA5, Y) before the merging point marker detection unit 25 detects the merging point marker M while the traveling is in process (SA4, N), the carrying cart is decelerated and the optical communications are performed with the optical communication unit 2C of the manufacturing device 1 as the transfer target via the optical communication unit 34 (SA6). When the optical communications are successfully performed and the manufacturing device 1 as the transfer target is checked (SA7), the traveling is stopped (SA8), the transferring processing for the wafer carrier is executed (SA9), and the processing from step SA1 is repeated.

Figure 6:
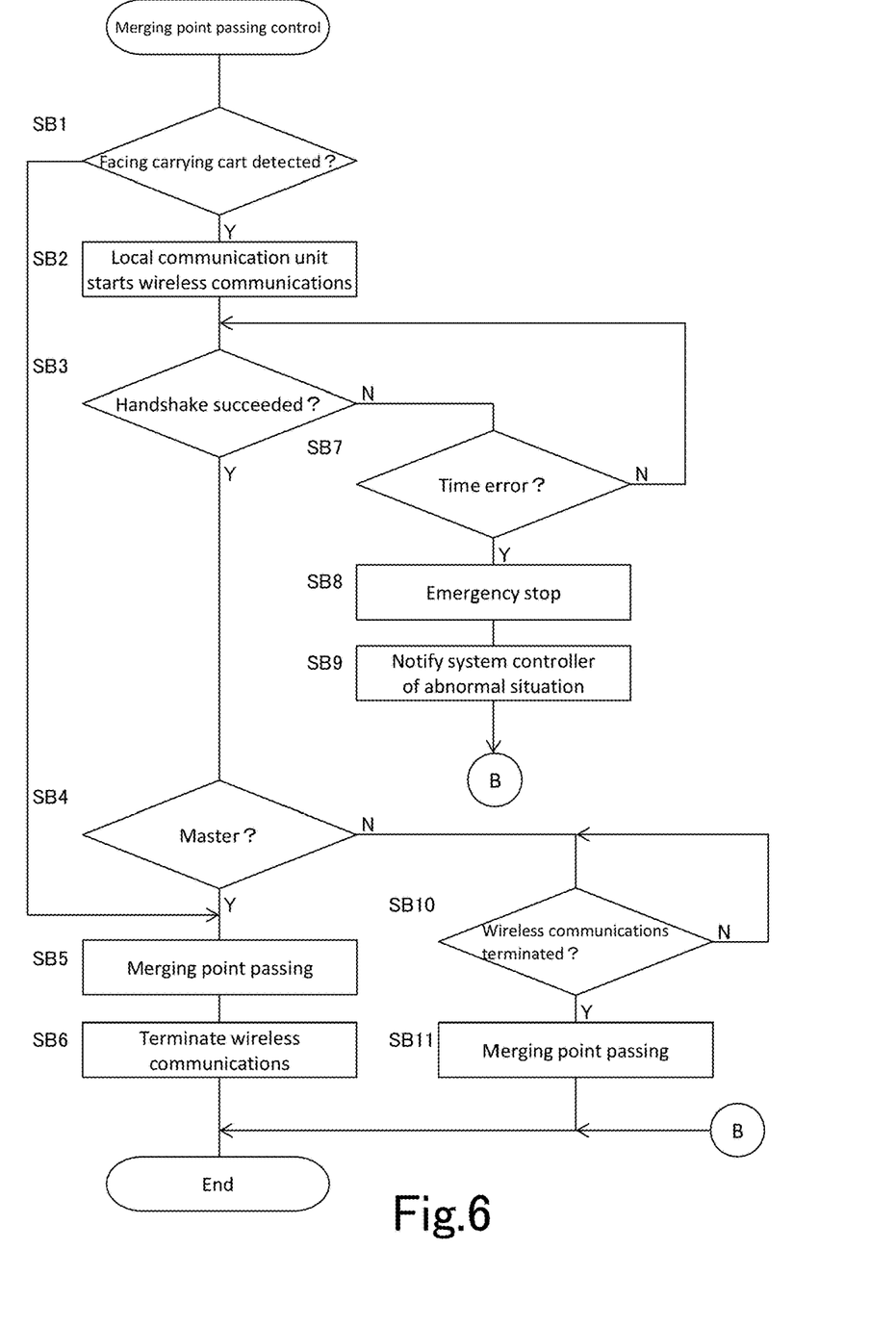
FIG. 6 is a flowchart illustrating merging point passing control performed by the conveyance control device.

FIG. 6 illustrates a detail of the merging point passing control in step SA11 described with reference to FIG. 5. Upon determining that another carrying cart 10 is in the merging point adjacent area 9 based on the output from the obstacle detection unit 26 (see FIG. 4A) (SB1), the travel control unit 24 (merging point adjacent area entering detection control unit 24a) starts predetermined wireless communication processing with the wireless communication unit 35 of the local communication unit 30 (SB2).

When the handshake is successfully performed with the other carrying cart 10 through the wireless communication (SB3, Y), the carrying cart 10 on the master station side, that is, the carrying cart 10 (see the reference numeral 10a in FIG. 4B) that has traveled through the route with a high priority (SB4, Y) performs the traveling control for traveling to the merging point CP. When the carrying cart passes through the merging point CP (SB5), the wireless communication processing is terminated (SB6).

When the handshake in step SB3 takes time, the carrying cart stops in the merging point adjacent area 9, and repeatedly performs wireless transmission during a wait time set in advance. When the wait time elapses (SB7), it is determined that an error has occurred, and emergency stop occurs (SB8). Then, the carrying cart transmits a signal indicating that an abnormal situation has occurred to the system controller H via the host interface 21 (SB9).

The carrying cart 10 determined to be on the slave station side in step SB3, that is, the carrying cart 10 (see the reference numeral 10b in FIG. 4B) that has traveled through the route with a low priority stops in the merging point adjacent area 9, and executes time error processing in and after step SB7 while waiting for an existence check notification from the master station.

The carrying cart 10 determined to be on the slave station side in step SB4, that is, the carrying cart 10 (see the reference numeral 10b in FIG. 4B) that has traveled through a route with a low priority (SB4, N) maintains the state of being stopped in the merging point adjacent area while the wireless communications with the master station are performed When the wireless communications with the master station are terminated (SB10), the carrying cart determines that the carrying cart 10 on the master station side has passed through the merging point CP, and then passes through the merging point (SB11).

Upon determining that there is no other carrying cart 10 in the merging point adjacent area 9 based on the output from the obstacle detection unit 26 in step SB1, the carrying cart passes through the merging point CP without decelerating or stopping in the merging point adjacent area (SB5). In this case, step SB6 is not executed.

Figure 7:
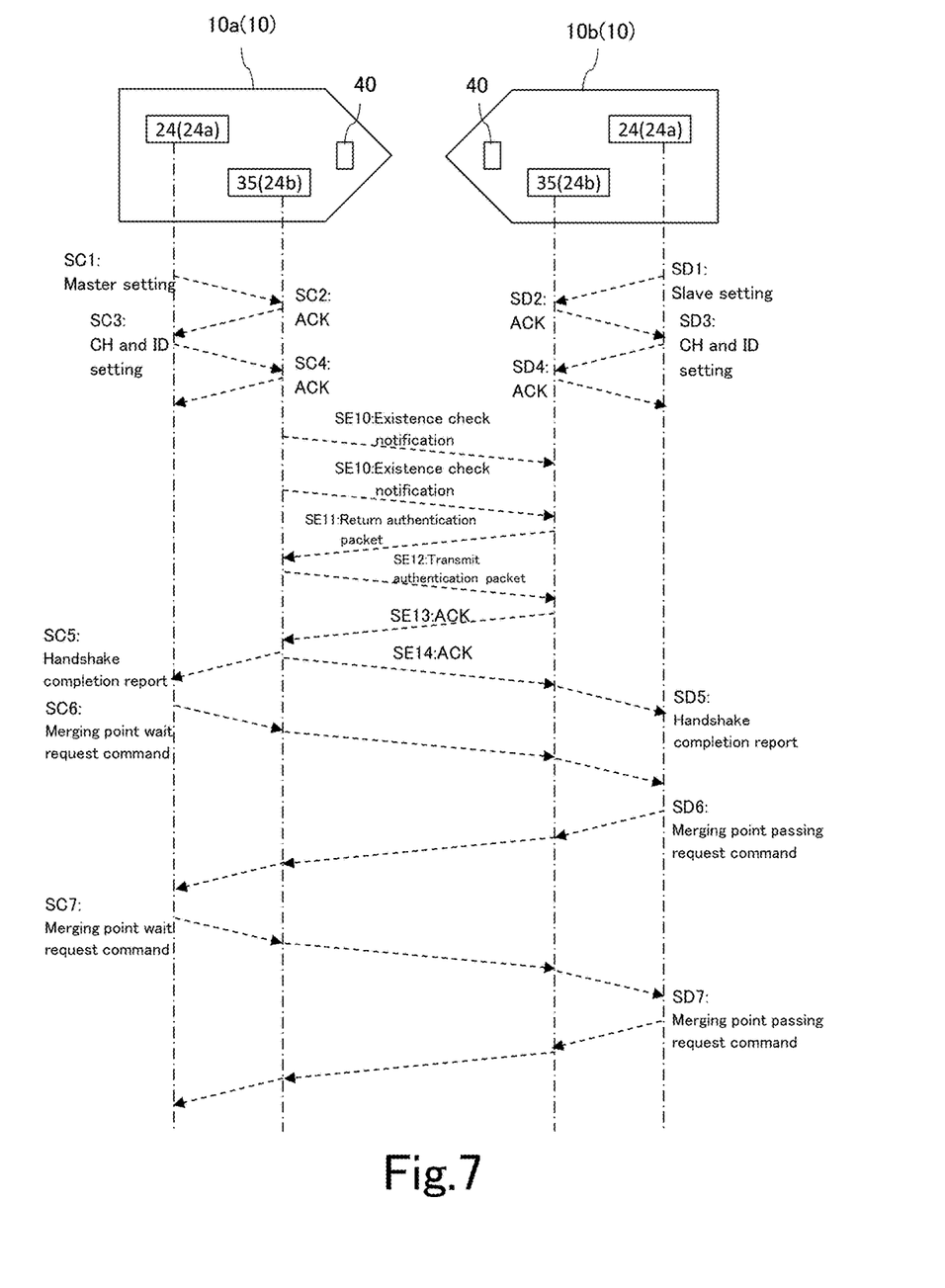
FIG. 7 is a diagram illustrating a communication procedure between the carrying cart around a merging point.

FIG. 7 illustrates a transmission/reception sequence and the like between the travel control unit 24 (the merging point adjacent area entering detection control unit 24a) and the wireless communication unit 35 (24b) of the carrying carts 10 facing each other.

When the merging point marker detection unit 25 detects the merging point marker M and the other carrying cart 10 is determined to be in the merging point adjacent area 9 based on the output from the obstacle detection unit 26, the travel control unit 24 of the carrying cart 10a that has approached the merging point adjacent area 9 through the traveling route with a high priority transmits setting information on a communication mode, set by the wireless communication unit 35, to the communication control unit 33 via the serial communication interfaces 27 and 31 (see FIG. 3).

Specifically, setting information indicating that the operation as the master station is performed is transmitted (SC1) and an acknowledge from the communication control unit 33 is detected (SC2). Then, channel information (frequency band) and ID information (identification code) with unique values set to each merging point adjacent area 9 are transmitted (SC3), and an acknowledge from the communication control unit 33 is detected (SC4). In this state, the wireless communication unit 35 controlled by the communication control unit 33 can perform wireless communications as the master station.

The travel control unit 24 of the carrying cart 10b that has approached the merging point adjacent area 9 through a traveling route with a low priority transmits setting information on the communication mode set by the wireless communication unit 35 to the communication control unit 33 via the serial communication interfaces 27 and 31 (see FIG. 3).

Specifically, setting information indicating that the operation as the communication slave station is performed is transmitted (SD1) and an acknowledge from the communication control unit 33 is detected (SD2). Then, channel information (frequency band) and ID information (identification code) with unique values set to each merging point adjacent area 9 are transmitted (SD3), and an acknowledge from the communication control unit 33 is detected (SD4). In this state, the wireless communication unit 35 controlled by the communication control unit 33 can perform wireless communications as the slave station.

The wireless communication unit 35 as the master station uses the set frequency band and the set identification code to transmit beacon communications, that is, the existence check notification to the wireless communication unit 35 on the slave station side until a response from the wireless communication unit 35 on the slave station side is received (SE10). Upon receiving the existence check notification on the master station side, the wireless communication unit 35 on the slave station side returns an authentication packet, indicating that the carrying cart is a proper carrying cart that appropriately operates in the manufacturing facility 100 with the same frequency band and the same identification code, as a response (SE11).

The carrying cart on the master station side that has received the authentication packet from the slave station side also transmits the authentication packet indicating that the carrying cart is a proper carrying cart that appropriately operates in the manufacturing facility 100 (SE12). The carrying cart that have received the authentication packets transmit the acknowledge to each other (SE13 and SE14). When this state is achieved, the carrying carts are in the state of approaching the same merging point adjacent area and acknowledging each other, that is, the handshake is successfully performed.

The communication control units 33 on the master station side and on the slave station side transmit handshake completion report to the travel control unit 24 via the serial communication interfaces 27 and 31 (SC5 and SD5).

Then, the travel control unit 24 on the master station side and the travel control unit 24 on the slave station side repeatedly transmit and receive predetermined command to and from each other via the corresponding wireless communication units 35 and 35 (SC6 and 7 and SD6 and 7). Specifically, the travel control unit 24 on the master station side transmits a merging point wait command to the travel control unit 24 on the slave station side and performs the traveling control so that the corresponding carrying cart passes through the merging point CP. The travel control unit 24 on the slave station side transmits a merging point passing request command to the travel control unit 24 on the master station side, and stops at the merging point adjacent area 9.

After passing through the merging point CP, the travel control unit 24 on the master station side stops the transmission to the slave station side via the wireless communication unit 35, and travels to the transfer target manufacturing device 1. When the reception from the master station side via the wireless communication unit 35 stops, the travel control unit 24 on the slave station side determines that the carrying cart 10a on the master station side has passed through the merging point CP, and starts traveling to the merging point CP.

As described above, a merging point passing method for a carrying cart according to the present invention includes a merging point adjacent area entering detection control step of detecting entering to a merging point adjacent area set on adjacent to each merging point on the conveyance route; an obstacle detection step of detecting whether there is an obstacle around the carrying cart; a wireless communication step of performing, when the entering to each merging point adjacent area is detected in the merging point adjacent area entering detection control step, local wireless communications with another carrying cart by using a common frequency band and a common identification code set to values different among merging points; and a merging point passing control step of starting the wireless communication step when the other carrying cart is detected in the merging point adjacent area in the obstacle detection step, and causing passing of a merging point in accordance with a priority set to each entering passage to the merging point, after a handshake with the other carrying cart is successfully performed in the wireless communication step.

The wireless communication step includes performing the handshake with a conveyance control device of the carrying cart that has entered through an entering passage with a high priority serving as a master station and a conveyance control device of a carrying cart that has entered through an entering passage with a low priority serving as a slave station, and the merging point passing control step includes causing passing in such a manner that the carrying cart that has entered through the entering passage with the high priority preferentially passes through the merging point, when the handshake is successfully performed.

The carrying cart that has entered through the entering passage with the low priority is configured to pass through the merging point, after a merging point passing completion signal has been received from the carrying cart that has entered through the entering passage with the high priority or when the handshake is not succeeded.

The merging point adjacent area entering detection control step includes detecting a marker disposed adjacent to the entering passage to each merging point, to determine entering to a corresponding merging point adjacent area.

The carrying cart is preferably configured to pass through the merging point without starting the wireless communication step or the merging point passing control step, when the obstacle detection step does not detect the other carrying cart.

In an example described in the embodiment, the light reflecting marker is used as the marker, and the reflective photosensor is used as the merging point marker detection unit. The marker is not limited to the light reflecting marker, and the merging point marker detection unit is not limited to the reflective photosensor. For example, a two-dimensional barcode may be used as the marker, and a barcode reader may be used as the merging point marker detection unit. Furthermore, a magnet ma be used as the marker and a reed switch may be used as the merging point marker detection unit.

In an example described in the embodiment, the me ring point adjacent area entering detection control unit starts the wireless communication unit and stops the traveling of the carrying cart on the upstream side of the merging point, that is, a collision free position, upon detecting the entering to the merging point adjacent area, set adjacent to each merging point, based on an output from the merging point marker detection unit and determining that the other carrying cart is in the merging point adjacent area based on the output from the obstacle detection unit. The obstacle detection unit is not an essential element of the present invention.

For example, the wireless communication unit may be started and traveling of the carrying cart may be stopped at the position on the upstream side of the merging point, that is, the collision free position, upon detecting the entering to the merging point adjacent area, set adjacent to each merging point, based on the output from the merging point marker detection unit.

In such a case, the control may be performed in such a manner that an attempt to perform the handshake is performed for a predetermined period time after the wireless communication unit is started, and the carrying cart passes through the merging point CP upon determining that the other carrying cart is not in the merging point adjacent area due to the failure to perform the handshake.

Also in this configuration, the other carrying cart can be accurately recognized when the handshake is successfully performed.

As described above, the present invention can provide a conveyance control device and a merging point passing method for a carrying cart with which passing of a merging point can be achieved more certainly and safely, without increasing the facility cost and wireless interference.

Any embodiment described above is merely an example of the present invention, and the scope of the present invention is not limited to this description. Specific configurations of the components of the carrying cart, the functional blocks of the conveyance control device and the like can be changed as appropriate as long as the advantageous effects of the present invention can be provided.

What is claimed is:

1. A conveyance control device that is installed in a carrying cart and controls the carrying cart to travel along a predetermined conveyance route based on an instruction from a system controller, the device comprising:
   a merging point adjacent area entering detection control unit configured to detect entering to a merging point adjacent area set on adjacent to each merging point on the conveyance route;
   an obstacle detection unit configured to detect whether there is an obstacle around the carrying cart;
   a wireless communication unit configured to perform, when the merging point adjacent area entering detection control unit detects the entering to each merging point adjacent area, local wireless communications with another carrying cart by using a common frequency band and a common identification code set to values different among merging points; and
   a merging point passing control unit configured to start the wireless communication unit when the obstacle detection unit detects the other carrying cart in the merging point adjacent area, and to cause passing of a merging point in accordance with a priority set to each entering passage to the merging point, after a handshake with the other carrying cart is successfully performed with the wireless communication unit.

2. The conveyance control device according to claim 1, wherein
   the wireless communication unit is configured to perform the handshake with a conveyance control device of the carrying cart that has entered through an entering passage with a high priority serving as a master station and a conveyance control device of a carrying cart that has entered through an entering passage with a low priority serving as a slave station, and
   the merging point passing control unit is configured to pass preferentially the carrying cart that has entered through the entering passage with the high priority through the merging point, when the handshake is successfully performed.

3. The conveyance control device according to claim 2, wherein the carrying cart that has entered through the entering passage with the low priority is configured to pass through the merging point, after a merging point passing completion signal has been received from the carrying cart that has entered through the entering passage with the high priority or when the handshake is not succeeded.

4. The conveyance control device according to claim 1, wherein the merging point adjacent area entering detection control unit is configured to detect a marker disposed adjacent to the entering passage to each merging point, to determine entering to a corresponding merging point adjacent area.

5. The conveyance control device according to claim 1, further comprising a storage unit configured to store in advance, a frequency band and an identification code set to each merging point and/or priority of each entering passage.

6. The conveyance control device according to claim 1, wherein the carrying cart is configured to pass through the merging point without starting the wireless communication unit or the merging point passing control unit, when the obstacle detection unit does not detect the other carrying cart.

7. The conveyance control device according to claim 1, further comprising an optical communication unit configured to perform communications with which a load is transferred between the carrying cart and a station used for transferring the load under control by the conveyance control device, the wireless communication unit being integrally embedded in the optical communication unit, wherein
   the conveyance control device is configured to start, when the merging point adjacent area entering detection control unit detects the entering to the merging point adjacent area, the wireless communication unit instead of the optical communication unit and to start, when the carrying cart comes close to the station, the optical communication unit instead of the wireless communication unit.

8. The conveyance control device according to claim 2, further comprising a storage unit configured to store in advance, a frequency band and an identification code set to each merging point and/or priority of each entering passage.

9. The conveyance control device according to claim 3, further comprising a storage unit configured to store in advance, a frequency band and an identification code set to each merging point and/or priority of each entering passage.

10. A merging point passing method for a carrying cart, the method being performed by a conveyance control device that is installed in a carrying cart and controls the carrying cart to travel along a predetermined conveyance route based on an instruction from a system controller, the method comprising:
    a merging point adjacent area entering detection control step of detecting entering to a merging point adjacent area set on adjacent to each merging point on the conveyance route;
    an obstacle detection step of detecting whether there is an obstacle around the carrying cart;
    a wireless communication step of performing, when the entering to each merging point adjacent area is detected in the merging point adjacent area entering detection control step, local wireless communications with another carrying cart by using a common frequency band and a common identification code set to values different among merging points; and
    a merging point passing control step of starting the wireless communication step when the other carrying cart is detected in the merging point adjacent area in the obstacle detection step, and causing passing of a merging point in accordance with a priority set to each entering passage to the merging point, after a handshake with the other carrying cart is successfully performed in the wireless communication step.

11. The merging point passing method for a carrying cart according to claim 10, wherein
    the wireless communication step includes performing the handshake with a conveyance control device of the carrying cart that has entered through an entering passage with a high priority serving as a master station and a conveyance control device of a carrying cart that has entered through an entering passage with a low priority serving as a slave station, and
    the merging point passing control step includes causing the carrying cart that has entered through the entering passage with the high priority to preferentially pass through the merging point, when the handshake is successfully performed.

12. The merging point passing method for a carrying cart according to claim 11, wherein the carrying cart that has entered through the entering passage with the low priority is configured to pass through the merging point, after a merging point passing completion signal has been received from the carrying cart that has entered through the entering passage with the high priority or when the handshake is not succeeded.

13. The merging point passing method for a carrying cart according to claim 10, wherein the merging point adjacent area entering detection control step includes detecting a marker disposed adjacent to the entering passage to each merging point, to determine entering to a corresponding merging point adjacent area.

14. The merging point passing method for a carrying cart according to claim 11, wherein the merging point adjacent area entering detection control step includes detecting a marker disposed adjacent to the entering passage to each merging point, to determine entering to a corresponding merging point adjacent area.

15. The merging point passing method for a carrying cart according to claim 11, wherein a frequency band and an identification code set to each merging point and/or priority of each entering passage are stored in advance in a storage unit included in the conveyance control device.

16. The merging point passing method for a carrying cart according to claim 11, wherein the carrying cart is configured to pass through the merging point without starting the wireless communication step or the merging point passing control step, when the obstacle detection step does not detect the other carrying cart.

17. The merging point passing method for a carrying cart according to claim 12, wherein the merging point adjacent area entering detection control step includes detecting a marker disposed adjacent to the entering passage to each merging point, to determine entering to a corresponding merging point adjacent area.

18. The merging point passing method for a carrying cart according to claim 12, wherein a frequency band and an identification code set to each merging point and/or priority of each entering passage are stored in advance in a storage unit included in the conveyance control device.

19. A merging point passing method for a plurality of carrying carts autonomously traveling along a conveyance route comprising:

causing one of the carrying carts entering a merging point adjacent area to stop or decelerate when another one of the carrying carts is detected;

causing the one of the carrying carts to perform wireless communications with the other one of the carrying carts by using a common frequency band and identification code that are set to different values among merging points; and causing one of the carrying carts corresponding to a high priority to preferentially pass through the merging point when a handshake is successfully performed, and then causing another one of the carrying carts corresponding to a low priority to pass through the merging point when the handshake is not succeeded, the priority being set to each entering passage to the merging point.

20. The merging point passing method according to claim 19, wherein the carrying carts entering the merging point adjacent area are each configured to pass through the merging point without stopping, when another one of the carrying carts is not detected.

* * * * *